(12) United States Patent
Hussain et al.

(10) Patent No.: US 7,229,874 B2
(45) Date of Patent: Jun. 12, 2007

(54) METHOD AND APPARATUS FOR ALLOWING FORMATION OF SELF-ALIGNED BASE CONTACTS

(75) Inventors: Tahir Hussain, Calabasas, CA (US); Rajesh D. Rajavel, Oak Park, CA (US); Mary C. Montes, West Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 52 days.

(21) Appl. No.: 10/778,525

(22) Filed: Feb. 12, 2004

(65) Prior Publication Data

US 2005/0029625 A1    Feb. 10, 2005

Related U.S. Application Data

(60) Provisional application No. 60/493,696, filed on Aug. 8, 2003.

(51) Int. Cl.
*H01L 21/8249* (2006.01)
*H01L 21/336* (2006.01)
*H01L 21/331* (2006.01)

(52) U.S. Cl. .............. 438/235; 438/285; 438/309; 438/312

(58) Field of Classification Search ............... 257/197, 257/198, 200, 201; 438/235, 309, 312, 285
See application file for complete search history.

(56) References Cited

U.S. PATENT DOCUMENTS

| | | | | |
|---|---|---|---|---|
| 4,716,445 A | * | 12/1987 | Sone ..................... | 257/191 |
| 5,288,660 A | * | 2/1994 | Hua et al. ............. | 438/571 |
| 5,726,468 A | * | 3/1998 | Oku et al. ............. | 257/197 |
| 5,739,062 A | * | 4/1998 | Yoshida et al. ........ | 438/320 |
| 5,986,326 A | * | 11/1999 | Kato ..................... | 257/593 |

OTHER PUBLICATIONS

Masuda, Hiroshi, et al., "Novel Self-Aligned Sub-micron Emitter InP/InGaAs HBT's Using T-Shaped Emitter Electrode," *1995 Conference Proceedings*, pp. 644-647 (1995).

* cited by examiner

*Primary Examiner*—Sara Crane
*Assistant Examiner*—Samuel A. Gebremariam
(74) *Attorney, Agent, or Firm*—Ladas & Parry

(57) ABSTRACT

A method and apparatus for depositing self-aligned base contacts where over-etching the emitter sidewall to undercut the emitter contact is not needed. A semiconductor structure has a T-shaped emitter contact that comprises a T-top and T-foot. The T-top acts as a mask for depositing the base contacts. In forming the T-top, its dimensions may be varied, thereby allowing the spacing between the base contacts and emitter to be adjusted.

9 Claims, 6 Drawing Sheets

METHOD AND APPARATUS FOR ALLOWING FORMATION OF SELF-ALIGNED BASE CONTACTS

CROSS-REFERENCE TO RELATED APPLICATIONS

The present application is related to and claims the benefit of co-pending U.S. Provisional Patent Application Ser. No. 60/493,696, filed on Aug. 8, 2003 and titled "Method and Apparatus for Allowing Formation of Self-Aligned Base Contacts." The disclosure of U.S. Provisional Patent Application 60/493,696 is incorporated herein by reference in its entirety.

FIELD

The present disclosure relates to a method and apparatus for allowing formation of self-aligned base contacts. More specifically, the present disclosure describes a method and apparatus for depositing self-aligned base contacts with an added degree of freedom.

BACKGROUND

Fabricating base contacts in heterojunction bipolar transistors (HBT's) using self-alignment techniques is commonly used, because self alignment techniques allow the base contacts to be placed as close to the emitter as possible, which helps reduce extrinsic resistance in the HBT. Shown in FIG. 1A is an HBT. The HBT is fabricated on a substrate, and includes a subcollector 20, collector 30, base 40, emitter 50, collector contact 60, base contacts 70, and emitter contact 80. The base contacts 70 are fabricated using a self-alignment technique. In this technique, the portion of the emitter 50 not covered by the emitter contact 80 is etched away using an isotropic wet-etchant. The wet-etchant also etches away a portion of the emitter 50 (i. e., over-etches) located under the emitter contact 80 to create an emitter having a slanted or sloped sidewall, which undercuts the emitter contact 80. The sloped sidewall is a result of the isotropic nature of the etchant. Subsequently, the base contacts 70 are deposited on the base 40 by metal evaporation using the emitter contact 80 as a "mask", as shown in FIG. 1A. By using the emitter contact 80 as a "mask" and controlling the "undercut" of the emitter 50 under the emitter contact 80, the spacing between the emitter 50 and base contacts 70 can ideally be controlled.

However, one problem with the self-alignment technique is the use of wet-etching to over-etch the emitter sidewall. Wet-etching does not always provide consistent results across all HBT's fabricated on a given wafer. As a result, the performance characteristics of all the HBT's cannot be accurately characterized. Furthermore, depending on the semiconductor used for the emitter, it is not always possible to over-etch the emitter sidewall. Indium Phosphide (InP), for example, is one semiconductor to which the over-etching technique is typically not applicable. As a result, a significant limitation is placed on the semiconductors that can be used in the HBT.

Inconsistencies in over-etching the emitter sidewall may also result in short-circuits between the base contacts 70 and emitter 50 as shown in FIG. 1B. Furthermore, even if the base contacts 70 are placed sufficiently far enough from the emitter 50 to prevent short-circuits, they may still lie close enough to the emitter 50 to generate an undesirable leakage current.

To overcome the problem with self-aligned base contacts using over-etching, base contacts which are lithographically aligned to the emitter are used. Using photoresist and either optical lithography or e-beam lithography, regions can be defined in the photoresist on the base, where the base contacts will be deposited. However, lithographically aligning the base contacts 70 places a high demand on the accuracy of the lithography tool. As a result, restrictions are placed on how close the base contacts 70 may be aligned to the emitter 50 sidewall. Furthermore, lithographically aligning the base contacts 70 often results in an asymmetrical placement of the base contacts 70 relative to the emitter 50, as shown in FIG. 1C.

Another approach for fabricating contacts involves depositing a metal stack on the emitter as discussed in H. Masuda et al., "Indium Phosphide and Related Materials," 1995, Conference Proceedings, pp. 644–647. The bottom layer in the metal stacks is tungsten silicide and the top layer is tungsten. These layers are used because when exposed to a reactive ion etch (RIE), the bottom layer etches faster than the top layer, allowing a T-shaped electrode to be formed. The T-shaped electrode is then used as a mask for depositing base contacts. However, using such a scheme results in excess parasitic resistance because the metals needed for such a technique have high resistivity.

As a result, there is a need for a method and apparatus that provides self-aligned base contacts that are symmetrically deposited with respect to the emitter. There is also a need for a method and apparatus that provides the desired spacing between the base contacts and emitter that does not rely on over-etching the emitter sidewall to undercut the emitter contact. There is also a further need for a method and apparatus that provides self-aligned base contacts and does not induce unnecessary excess parasitic resistance in the HBT.

SUMMARY

Embodiments of the present invention provide a method and apparatus for allowing formation of self-aligned base contacts. In one embodiment of the present invention, an emitter is disposed on a base. A T-shaped emitter contact is disposed on the emitter. The T-shaped emitter contact has a T-top that extends over a portion of the base. The portion of the T-top extending over the base acts as a "mask" for depositing the base contacts. As a result, the need for undercutting the emitter contact by over-etching the emitter sidewall to determine the spacing is eliminated. Furthermore, the T-shaped emitter contact may be fabricated using e-beam lithography, which allows the T-shaped emitter contact to be symmetrical with respect to the emitter. Finally, the T-shaped emitter contact can be fabricated using metal evaporation. As a result, metals such as gold can be used as the metal in the emitter contact to help reduce intrinsic resistance.

DETAILED DESCRIPTION

The present invention will now be described more fully hereinafter with reference to the accompanying drawings in which preferred embodiments of the invention are shown. This invention may be embodied in many different forms and should not be construed as limited to the embodiments set forth herein.

Figure 1A:
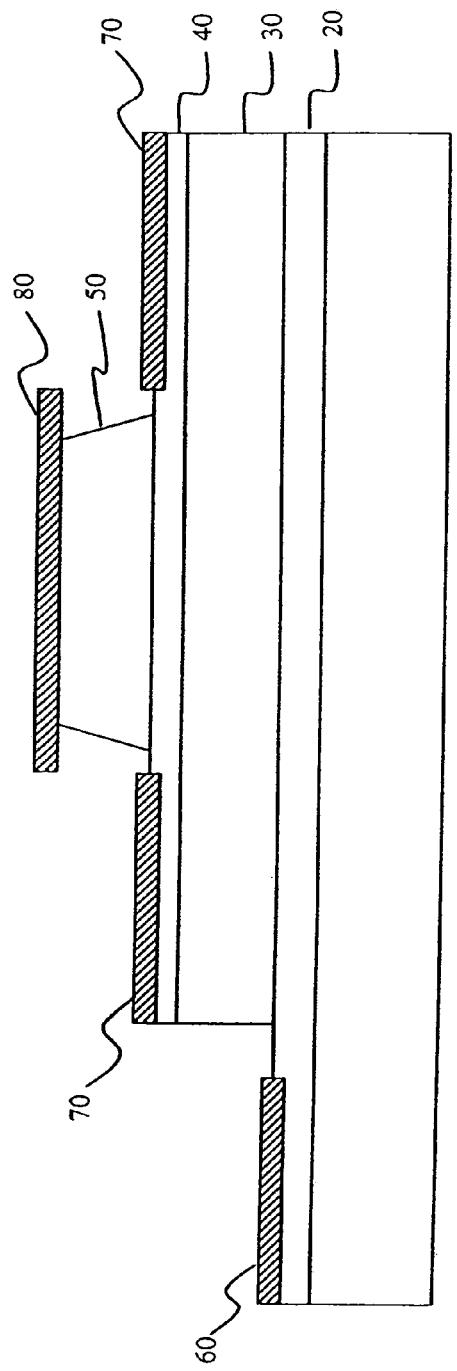
FIGS. 1A–1C illustrate HBT's according to the prior art.
Figure 1B:
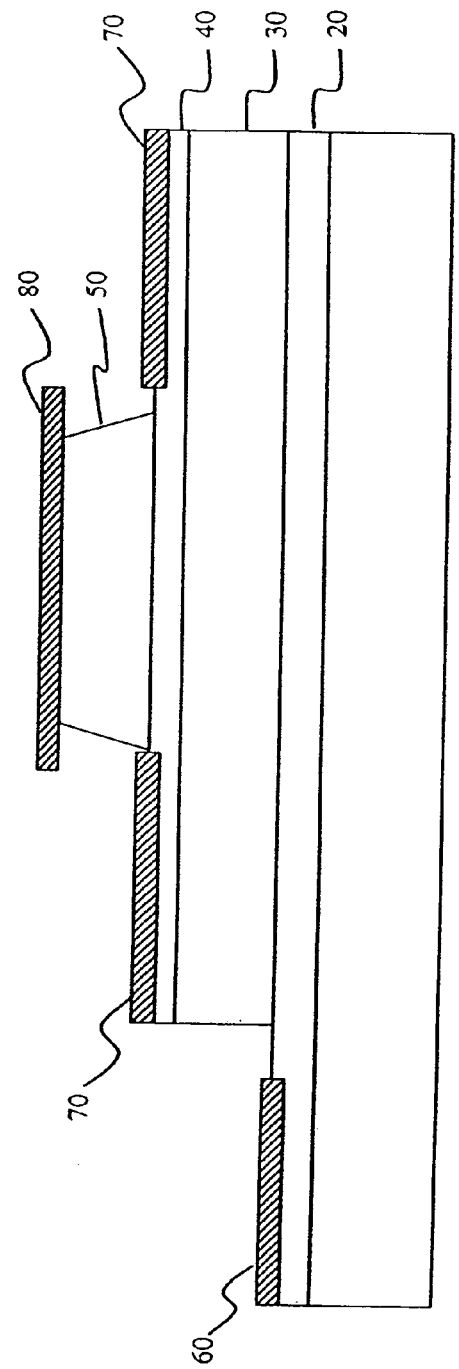
Figure 1C:
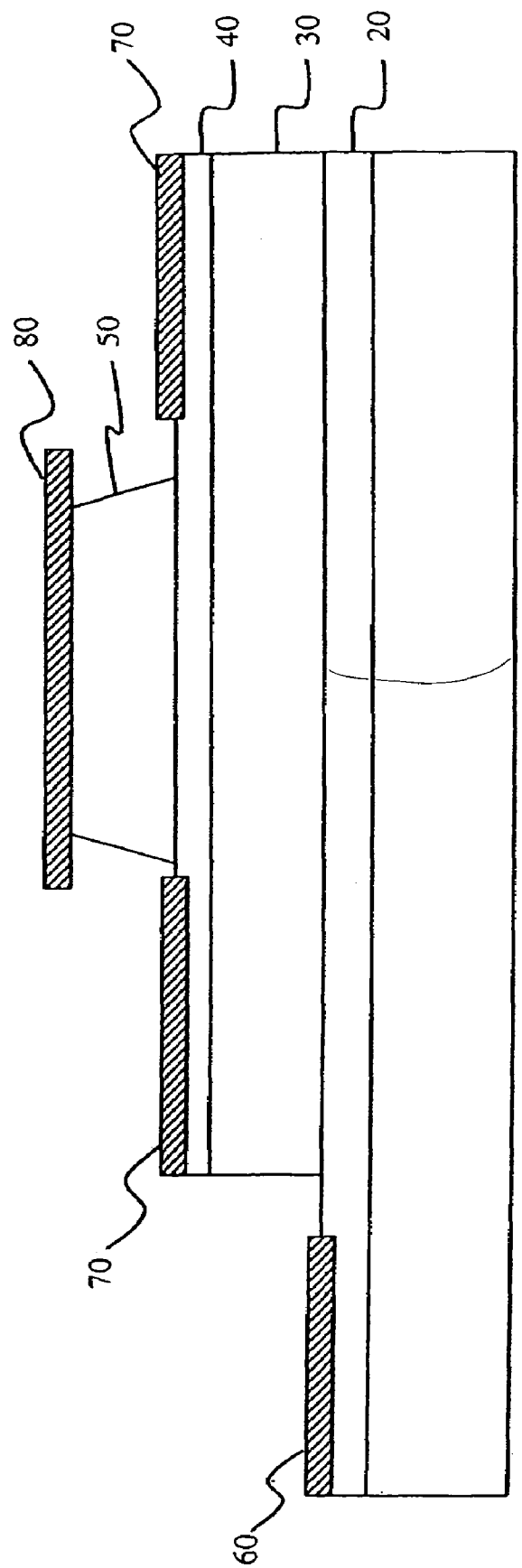
Figure 2:
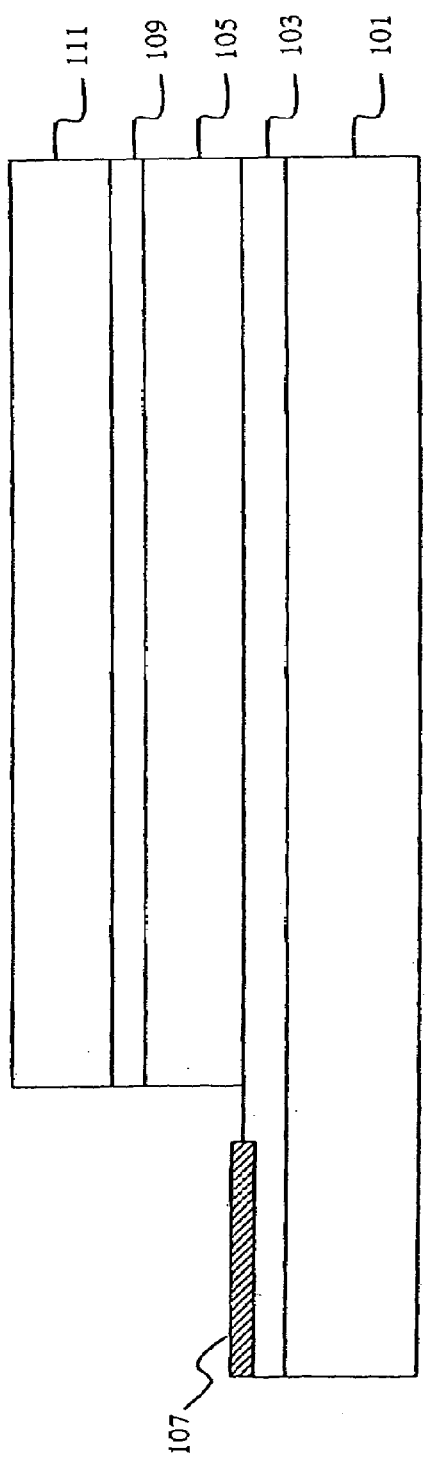
FIG. 2 illustrates a partially completed HBT according to an embodiment of the present invention.

The present invention according to at least one embodiment provides a method and apparatus for fabricating a HBT structure that allows for well-controlled deposition of self-aligned base contacts. Shown in FIG. 2 is a partially completed HBT structure used in an embodiment of the present invention. The structure comprises a substrate 101, collector 105, collector contact 107, base 109, and emitter 111. A subcollector layer 103 is also preferably provided between the substrate 101 and collector 105. The subcollector 103 is generally heavily doped so as to reduce the intrinsic resistance between the collector 105 and collector contact 107. The subcollector 103, collector 105, base 109, and emitter 111 preferably comprise group III–V materials. If the HBT is InP-based, then the collector 105 may comprise a compositional variation of InGaAsP, the base 109 may comprise InGaAs, and the emitter 111 may comprise InAlAs. If the HBT is GaAs-based, the collector 105 and base 109 may comprise GaAs, and the emitter 111 may comprise InGaP or AlGaAs. However, those skilled in the art will realize that there are a variety of materials that may be used in the HBT. The subcollector 103, collector 105, base 109, and emitter 111 may be fabricated using any one of multiple methods known in the art, but are preferably deposited using molecular beam epitaxy. Also, depending on the application, those skilled in the art will realize that collector 105, base 109, and emitter 111 may be doped. The collector contact 107 typically comprises a combination of Ti/Pt/Au, and is deposited on the subcollector 103 using techniques known in the art, such as photolithography and metal evaporation.

Figure 3A:
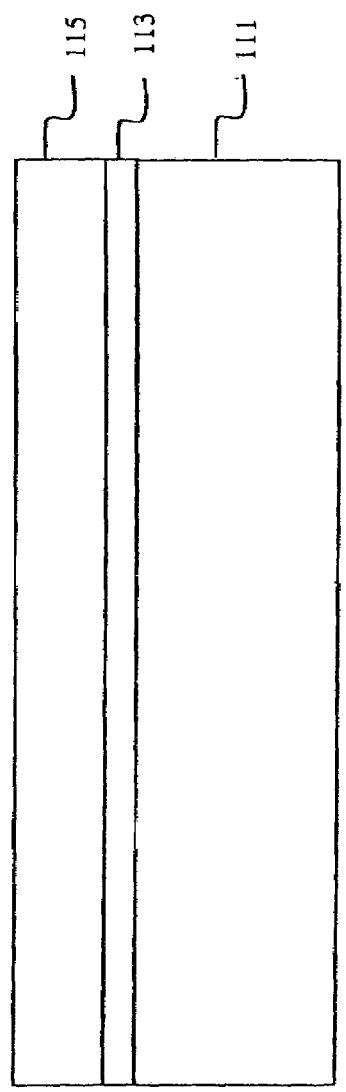
FIG. 3A illustrates a close-up view of the emitter shown in FIG. 2.

The next processing step is the formation of a T-shaped emitter contact. The T-shaped emitter contact is formed by first depositing a first electron sensitive resist layer 113 on the emitter 111, as shown in FIG. 3A. The first electron sensitive resist layer 113 is preferably in the range of 100–300 nm thick, and may comprise polymethyl methacrylate (PMMA), however any other high-resolution electron sensitive resist could work equally as well. A second electron sensitive resist layer 115 is subsequently deposited on the first electron sensitive resist layer 113. The second electron sensitive resist layer 115 is preferably in the range of 500–700 nm thick, and may comprise the co-polymer P(MMA—MMA), however any other high-sensitivity electron sensitive resist could work equally as well.

Figure 3B:
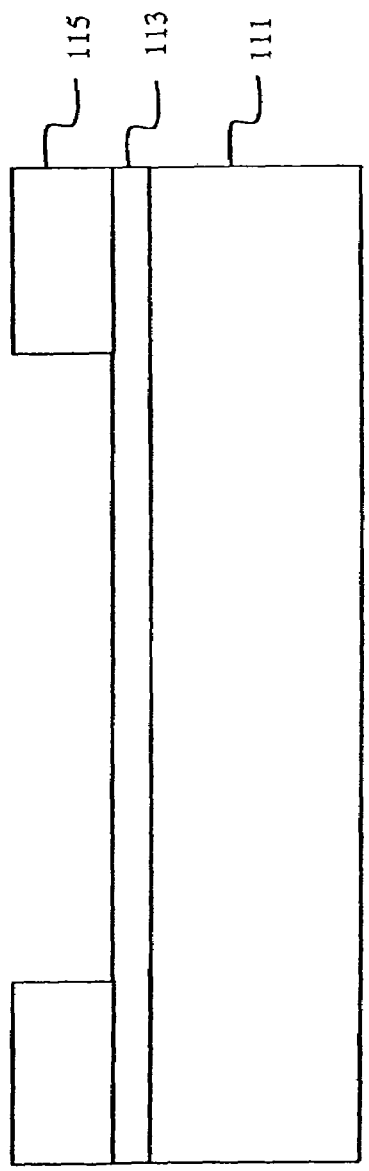
FIG. 3B illustrates the removal of a portion of one electron sensitive resist layer from the structure depicted in FIG. 3A.
Figure 3C:
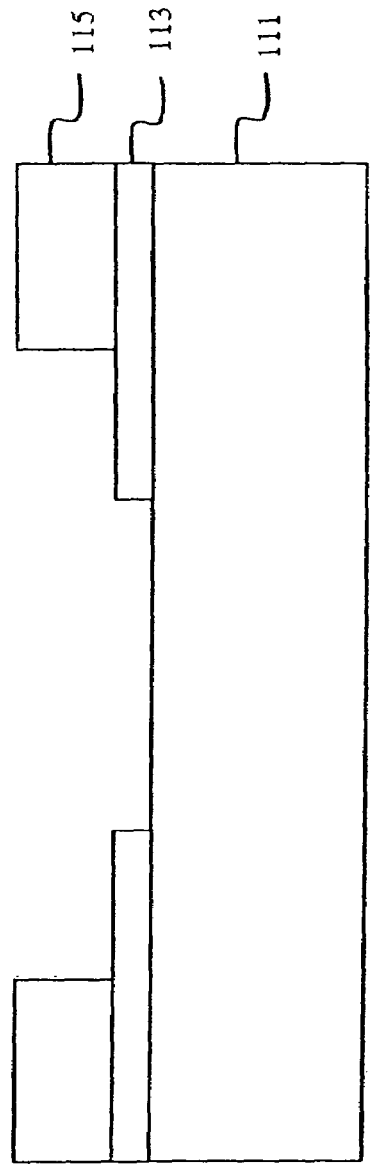
FIG. 3C illustrates the removal of portion of a second electron sensitive resist layer from the structure depicted in FIG. 3B.

Preferably, using an electron beam with energy in the range of 10–30 kV, a portion of the second electron sensitive resist layer 115 is exposed. The exposed portion is removed using, for example, methyl isobutyl ketone (MIBK) diluted in various concentrations with isopropyl alcohol (IPA), to create a mold for a T-top, as shown in FIG. 3B. The chemical which removes the exposed portion of the second electron sensitive resist layer 115 is chosen so that it does not affect the first electron sensitive resist layer 113. A second exposure is then made in the first electron sensitive resist layer 113 preferably using an electron beam with energy in the range of 50–100 kV. The second exposure is made in the middle of the region that was removed with the first exposure. After the second exposure, the exposed region is removed using, for example, propylene glycol monomethyl ether acetate (PGMEA) diluted in various concentrations with ethanol, to create a mold for the T-foot, as shown in FIG. 3C. The chemical which removes the exposed portion of the first electron sensitive resist layer 113 is chosen so that it does not affect the second electron sensitive resist layer 115. The combination of the T-top mold and T-foot mold provide the mold for the T-shaped emitter contact.

Figure 3D:
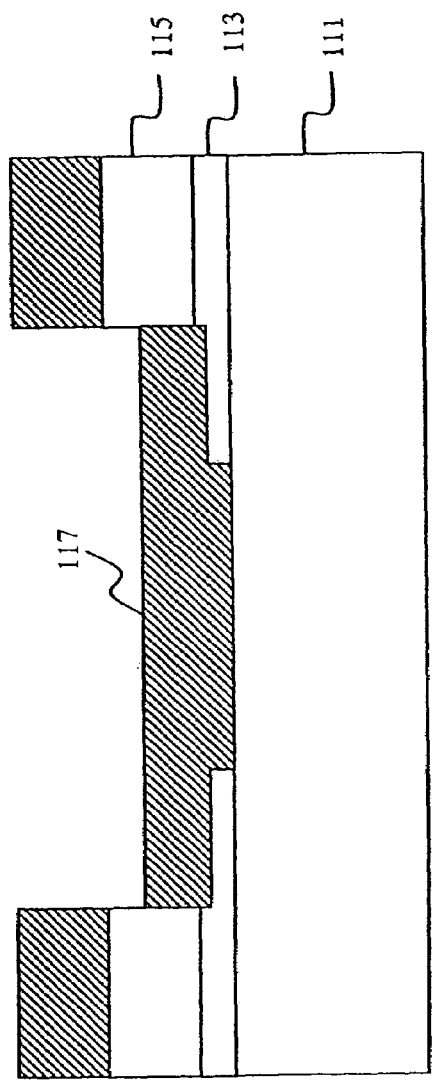
FIG. 3D illustrates metal for the T-shaped emitter contact deposited into the portions of the electron sensitive resist layers that were removed from the structure depicted in FIG. 3B.
Figure 4A:
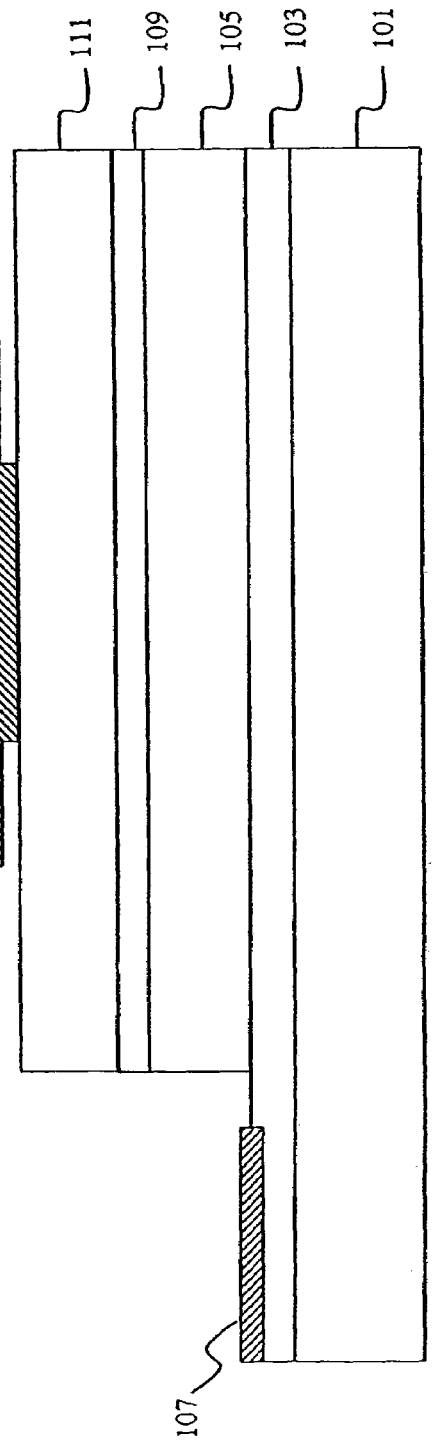
FIG. 4A illustrates the T-shaped emitter contact on the HBT structure depicted in FIG. 2.

Using, for example, metal evaporation, the mold for the T-shaped emitter contact is subsequently filled with a metal, to form the T-shaped emitter contact 117, shown in FIG. 3D. Gold is preferably used for the T-shaped emitter contact 117 because of its low resistance. However, a combination of Titanium, Platinum, and Gold may be deposited in the mold for the T-foot, followed by the deposition of Gold in the T-top. During the metal evaporation process, excess metal may form on the second electron sensitive resist layer 115. However this excess metal is removed during a subsequent lift-off process, which leaves only the emitter contact 117 on the emitter 111 as shown in FIG. 4A.

Figure 4B:
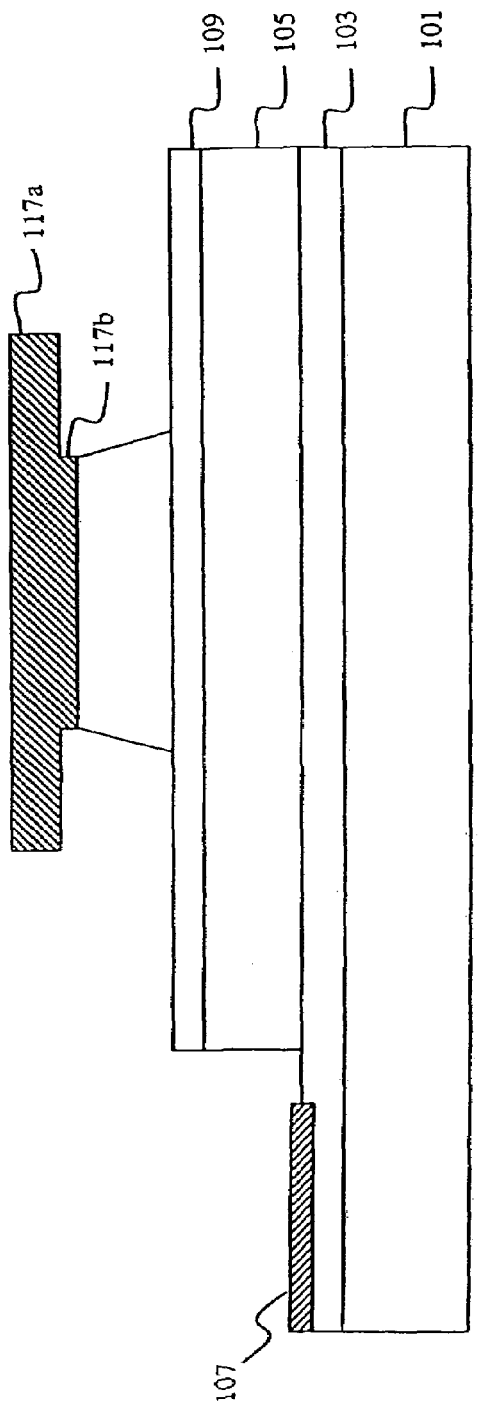
FIG. 4B illustrates a portion of the emitter being removed from the structure depicted in FIG. 4A to create a region where base contacts will be deposited.

Following the deposition of the T-shaped emitter contact 117, the portion of the emitter 111 not "masked" by the T-foot 117*b* of the emitter contact 117 is removed with a wet-etchant to create a region where base contacts will be deposited on the base 109, as shown in FIG. 4B. The sidewalls of the emitter 111 are slanted because of the isotropic nature of the wet-etchant. However, the removal of the emitter 111 material does undercut the emitter contact 117 as in the prior art, the benefits of which are discussed below. Of course, those skilled in the art will realize that during the etching process, emitter 111 may undercut the emitter contact 117 if desired.

Figure 4C:
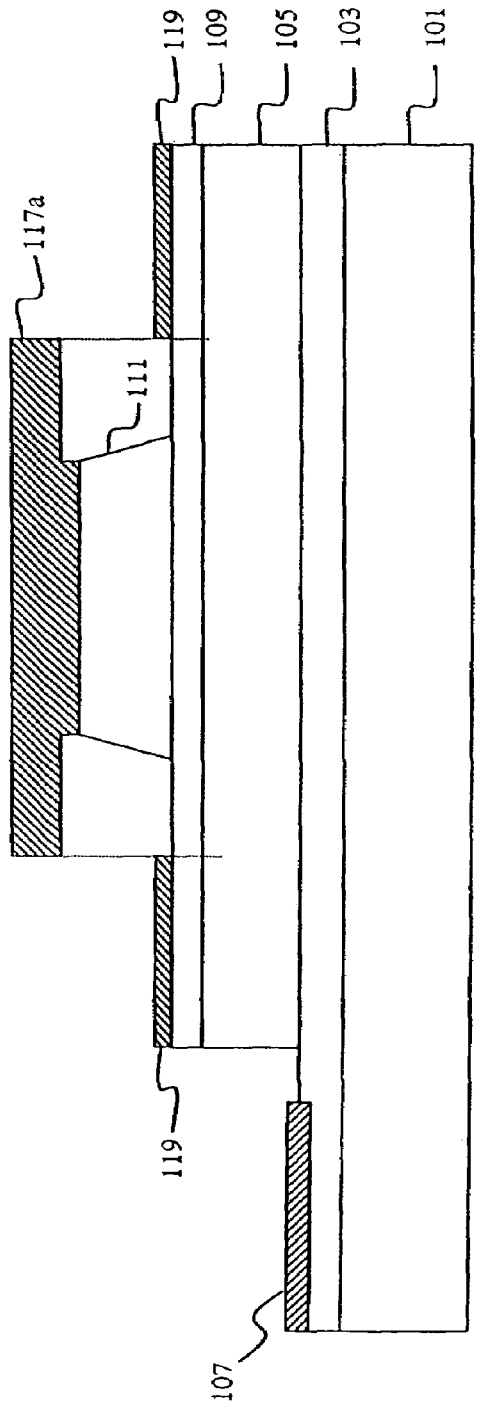
FIG. 4C illustrates the base contacts deposited on the base of the structure depicted in FIG. 4B and their alignment with the emitter contact.

Next, a lift-off process, such as one known in the art, is used to deposit base contacts on the base 109. During the lift-off process, regions where metal for the base contact is not desired are covered with photoresist. Then using metal evaporation, base contacts 119, preferably comprising Ti, Pt, Au in that order, are deposited on the base 109. Any excess metal that forms on the photoresist is removed using a lift-off process, thereby leaving the base contacts 119, as shown in FIG. 4C. When the base contacts 119 are deposited, the T-top 117*a* of the T-shaped emitter contact 117 effectively acts as a "mask" for the base contacts 119 and determines the spacing, preferably between 0.15–0.25 microns, between the base contacts 119 and the emitter 111.

As a result, it is clear that by varying the length of the region that is exposed in the second electron sensitive resist layer 115, the length of the T-top 117*a* can be adjusted. The ability to vary the length of the T-top 117*a* provides an additional degree of freedom in determining the spacing between the base contacts 119 and the emitter 111. The spacing between the base contacts 119 and the emitter 111 is determined by the extent to which the T-top 117*a* extends over the base 109, and not on the extent to which an over-etched emitter sidewall undercuts the emitter contact, as in the prior art. Furthermore, the use of e-beam lithography improves the symmetry of T-top 117*a* and T-foot 117*b* with respect to the emitter 111. Also, e-beam lithography can provide a T-top 117*a* having a desired length with extreme accuracy. Adjusting the length of the T-top to determine the spacing between the base contacts 119 and emitter 111 is significantly more accurate than using wet-etching to undercut the emitter contact to determine the spacing between the base contacts 119 and the emitter 111. As a result, the presence of short circuits and undesirable leakage current between the base contacts 119 and emitter 111 can be significantly reduced. Although this invention has been described with reference to HBT's, those skilled in the art will realize that this invention can be easily applied to other semiconductor device applications where there is a need for aligning contacts.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A method of forming a structure allowing formation of a self-aligned base contact comprising:
   providing an emitter disposed on a base;
   forming a T-shaped mold on top of the emitter; and
   forming a T-shaped emitter contact within the T-shaped mold and on top of the emitter, wherein the T-shaped emitter contact comprises a first portion and a second portion, the first portion contacting the emitter, and the second portion extending laterally beyond the emitter; and
   disposing one or more base contacts on the base after forming said T-shaped emitter contact;
   wherein forming the T-shaped mold comprises:
     providing a first and second layer of electron sensitive resist on the emitter;
     forming a mold for the first portion in the first layer of electron sensitive resist;
     forming a mold for the second portion in the second layer of electron sensitive resist, and wherein forming the T-shaped emitter contact comprises:
   evaporating metal in the T-shaped mold.

2. The method of claim 1, further comprising lifting-off the first and second layers of electron sensitive resist after the step of evaporating.

3. The method of claim 1, further comprising varying the dimensions of the mold for the second portion.

4. The method of claim 1, wherein the second portion determines the spacing between at least one base contact and the emitter.

5. The method of claim 1, wherein the second portion extends substantially parallel to the surface of the base on which the emitter is disposed.

6. The method of claim 1, further comprising:
   providing a substrate;
   providing a subcollector disposed on the substrate; and
   providing a collector disposed on a subcollector, wherein the base is disposed on the collector.

7. The method of claim 6, wherein the emitter, the base, the collector, and the subcollector are deposited epitaxially.

8. The method of claim 1, wherein at least one base contact comprises a combination of Titanium, Platinum, and Gold.

9. The method of claim 1, wherein the T-shaped emitter contact comprises Gold.

* * * * *